United States Patent
Dinger et al.

(10) Patent No.: US 7,557,902 B2
(45) Date of Patent: Jul. 7, 2009

(54) PROJECTION OBJECTIVE

(75) Inventors: Udo Dinger, Oberkochen (DE); Frank Eisert, Aalen (DE); Stefan Koehler, Aalen-.Ebnat (DE); Andreas Ochse, Oberkochen (DE); Johannes Zellner, Oberkochen (DE); Martin Lowisch, Oberkochen (DE); Timo Laufer, Aalen (DE)

(73) Assignee: Carl Zeiss SMT AG (DE)

( * ) Notice: Subject to any disclaimer, the term of this patent is extended or adjusted under 35 U.S.C. 154(b) by 523 days.

(21) Appl. No.: 10/577,163

(22) PCT Filed: Sep. 27, 2003

(86) PCT No.: PCT/EP03/10761

§ 371 (c)(1),
(2), (4) Date: Mar. 22, 2006

(87) PCT Pub. No.: WO2005/040925

PCT Pub. Date: May 6, 2005

(65) Prior Publication Data

US 2007/0035814 A1    Feb. 15, 2007

(51) Int. Cl.
G03B 27/54    (2006.01)
G06K 7/10    (2006.01)

(52) U.S. Cl. .................................. 355/67; 359/350

(58) Field of Classification Search ................... 355/77, 355/53, 67, 55, 57; 438/72, 947; 430/5, 430/322; 359/361, 350, 848; 419/20
See application file for complete search history.

(56) References Cited

U.S. PATENT DOCUMENTS

| 5,265,143 | A | 11/1993 | Early et al. |
|---|---|---|---|
| 6,353,470 | B1 | 3/2002 | Dinger |
| 6,867,913 | B2 | 3/2005 | Mann et al. |
| 2003/0123037 | A1 | 7/2003 | Box |
| 2005/0185307 | A1* | 8/2005 | Laufer et al. ................. 359/848 |

FOREIGN PATENT DOCUMENTS

| DE | 10037870 A1 | 2/2002 |
|---|---|---|
| DE | 10128086 A1 | 12/2002 |
| JP | 11-345760 A2 | 12/1999 |
| WO | 0108163 A1 | 2/2001 |
| WO | 03016233 A1 | 2/2003 |

* cited by examiner

*Primary Examiner*—Peter B Kim
(74) *Attorney, Agent, or Firm*—GrayRobinson PA

(57) ABSTRACT

A projection objective 1 for short wavelengths, in particular for wavelengths λ<157 nm is provided with a number of mirrors [M1, M2, M3, M4, M5 and M6] that are arranged positioned precisely in relation to an optical axis 5. The mirrors [M1, M2, M3, M4, M5 and M6] have multilayer coatings. At least two different mirror materials are provided which differ in the rise in the coefficient of thermal expansion as a function of temperature in the region of the zero crossing of the coefficients of thermal expansion, in particular in the sign of the size.

25 Claims, 3 Drawing Sheets

PROJECTION OBJECTIVE

BACKGROUND OF THE INVENTION

1. Field of the Invention

The invention relates to a projection objective for short wavelengths, in particular for wavelengths λ<157 nm, having a number of mirrors that are arranged positioned precisely in relation to an optical axis, and wherein the mirrors have multilayer coatings. The invention also relates to a projection exposure apparatus for EUV lithography as well as an X-ray optical subsystem for X-rays of wavelength $\lambda_R$.

2. Description of the Related Art

Projection objectives that are used in the extreme ultraviolet region are transradiated with soft X-radiation. Here, the wavelength region is at 10 to 30 nm. The materials previously capable of use for the optics are opaque to the extreme UV light used in the case, the imaging beams no longer being guided through lenses by refraction, but it being possible only to make use of mirrors. The mirrors used should have as high a reflectivity as possible in the EUV region. Such mirrors comprise a substrate that is provided with a multilayer system, also termed multilayer. This permits the implementation of mirrors of high reflectivity in the X-ray region when the incidence is not grazing, that is to say the implementation of normal incidence mirrors. Layer systems, for example with Mo/Si (molybdenum/silicon), Mo/Be (molybdenum/beryllium), MoRu/Be layer stacks with 40 to 100 layer pairs can be used for such multilayer systems, it being possible thereby to achieve peak reflectivities of 70 to 80% in the EUV region with λ=10 to 20 nm. Different layer systems can be used depending on the wavelength of the light to be reflected.

A high reflectivity of the layer stacks can be achieved by in-phase superposition and constructive interference of the partial wavefronts reflected at the individual layers. The layer thicknesses should, moreover, typically be controlled in the sub-Ångström region (<0.1 nm) in this case.

Multilayer-coated X-ray mirrors are operated near normal incidence, and are always preferred to those mirrors, coated with simpler layers, with grazing incidence whenever there is a requirement for a high imaging quality owing to slight aberrations, preferably in imaging systems. The reflectivity of grazing incidence mirrors can, however, be further increased nevertheless by applying a multilayer.

For mirrors, in particular X-ray mirrors, of a EUVL projection objective or projection system, the properties described below should be fulfilled at the same time; these ensure that the structures can be transferred onto the wafer in a fashion faithful to the mask, and enable a high contrast of the image and a high reflectivity of the reflective layer.

A good figure, that is to say errors in the low spatial frequency region, could be mentioned as first property. This is to be understood in general as structural sizes between 1/10 over the beam cross sections assigned by the individual pixels, up to a free diameter of the mirror. This means that the errors have lateral extents of an order of magnitude from a millimeter up to a number of decimeters. Such errors lead to aberrations, and thereby reduce the imaging quality and restrict the resolution limit of the overall system.

Furthermore, the X-ray mirrors should have a slight roughness in the MSFR (mid spatial frequency roughness) region (middle spatial frequency region). Such spatial wavelengths typically occur in the region between approximately 1 μm and approximately 1 mm, and lead to scattered light within the image field, and therefore to contrast losses in the imaging optics.

Requisite conditions for achieving high reflectivities are sufficiently low layer and substrate roughnesses in the so-called HSFR (high spatial frequency roughness) region. Depending on the point of view, the HSFR region leads to light losses by scattering outside the image field of the optics, or owing to interference in the microscopically in-phase superposition of the wavetrain components. The relevant spatial wavelength region is bounded above by the criterion of scattering outside the image field and, depending on application, is situated at EUV wavelengths in the region of a few μm. In general no bound is defined at the high-frequency limit. It is thereby possible to specify a reasonable guideline in the range of half the wavelength of the incident light, since in accordance with prior knowledge even higher spatial frequencies of the incident photons can no longer be seen. The HSFR can be measured by the known atomic force microscopes (AFM) which have the requisite lateral and vertical resolution. It is necessary in projection optics to control both figure and the MSFR and the HSFR to within a few Ångström rms (root mean square).

Furthermore, use should be made for the X-ray mirrors of materials that have the smallest coefficient of thermal expansion possible such as, for example ZERODUR® or ULE®. It is thereby possible to keep the surface shape of the mirror stable even during operation under thermal loads. Even monocrystalline silicon could be used as a carrier, since it permits very low roughnesses. Furthermore, in silicon the higher coefficient of thermal expansion can be partially compensated by the substantially higher thermal conductivity and a suitable cooling. However, silicon has a mechanical anisotropy, and can generally be used only for small mirror sizes, owing to the required monocrystallinity. Moreover, the comparatively high price of the monocrystalline material is a substantial disadvantage. Consequently, silicon will be used only in the event of very high thermal loads, for example in illumination systems.

It has emerged that consideration has so far been given only to suitable glass ceramic materials, for example Schott: ZERODUR®, Ohara: CLEARCERAM-Z®, or also amorphous titanium silicate glasses, for example Corning: ULE®, for such mirrors, since these materials have a coefficient of thermal expansion (CTE) that can be made to vanish at a specific temperature that is also denoted as zero crossing temperature (ZT). ZERODUR® is a registered trademark of Schott AG of Mainz, Germany; CLEARCERAM-Z® is a registered trademark of Kabushiki Kaisha Ohara of Kanagawa, Japan, and ULE® is a registered trademark of Corning Incorporated of Corning, N.Y. In the case of finite, local and global deviations of the operating temperature from the zero crossing temperature, the coefficient of thermal expansion does not however, vanish completely, and a deformation of the surface therefore results. The tolerances for these deformations are approximately 100 nm for global, homogeneous deformations of the mirror, and in the region of 50 pm-200 pm for local spatially varying deformations. It has emerged from the conduct of simulations that, in particular, distortion errors of the projection objective, the optical components contained therein consisting either only of ULE® or only of ZERODUR®, react so sensitively to thermal loads that they must be compensated during operation by means of expensive manipulators and with the acceptance of dead times.

When the materials currently used are employed, the system quality that can be achieved with regard to X-ray optics is greatly impaired in different ways.

Reference may be made as regards the projection optics for EUV lithography and the X-ray optical components used to DE 100 37 870 A1 and to U.S. Pat. No. 6,353,470 B1, the statements of which are also fully incorporated into the present application.

Titanium silicate glass, also known as ULE®, is specifically specified in WO 01/08163 A1 for projection objectives in EUV lithography. That document describes a projection lithography method for producing integrated circuits and generated patterns with extremely small object dimensions. An illumination subsystem illuminates a mask or a reticle with X-radiation. A projection subsystem has reflective, multilayer coated titanium silicate glasses that have a faultless surface. In the inventive method, the titanium silicate glasses are heated by means of the X-radiation to an operating temperature, the level of titanium doping substance preferably being regulated in such a way that the glass has a coefficient of thermal expansion that is centered on zero at the operating temperature. The titanium silicate glass specified here therefore has a variation of $\leq 10$ ppb in the coefficient of thermal expansion.

SUMMARY OF THE INVENTION

It is an object of the invention to provide an projection objective of the abovementioned type while avoiding the disadvantages of the prior art, and in the case of which the overall imaging quality is improved even in the event of temperature increases, and the scattered light characteristic is optimized.

According to the invention, the object is achieved by virtue of the fact that there are provided at least two different mirror materials that differ in the rise in coefficient of thermal expansion as a function of the temperature in the region of the zero crossing of the coefficients of thermal expansion, in particular in the sign of the rise, use in an EUV region with wavelengths $\lambda<20$ nm advantageously being provided.

In the case of such wavelengths of $\lambda<20$ nm, the projection objective is constructed with mirrors that reflect the optical radiation. The construction of the projection objective with at least two different mirror materials, the mirrors materials having a very low coefficient of thermal expansion, is advantageous to the effect that it is possible by means of a suitable assignment of the materials to the individual mirrors to balance out or compensate the aberrations of the projection objective with reference to local and global temperature increases such that the resulting effects are minimized. By means of the suitable arrangement of the mirror materials in the projection objective, the projection objective can be operated with relatively strong light sources, something which consequently ensures a higher wafer throughput, and thus a greater productivity. On the other hand, given a fixed thermal load it is possible to relax the requirement placed on the coefficient of thermal expansion (CTE) of the materials, something which consequently enables a higher product yield, and therefore a more economic use of the materials.

An advantageous refinement of the invention can provide that at least one mirror made from a glass ceramic material and at least one mirror made from an amorphous titanium silicate glass are provided.

The coefficients of thermal expansion of a glass ceramic material and an amorphous titanium silicate glass are so small that they can be made to vanish at a specific temperature. By using such materials as mirror substrates in conjunction with correctly allocating the materials to the mirrors, it is possible to minimize aberrations substantially and to improve the overall system quality.

Exemplary embodiments of the invention are explained in more detail below with the aid of schematic drawings.

DETAILED DESCRIPTION

Figure 1:
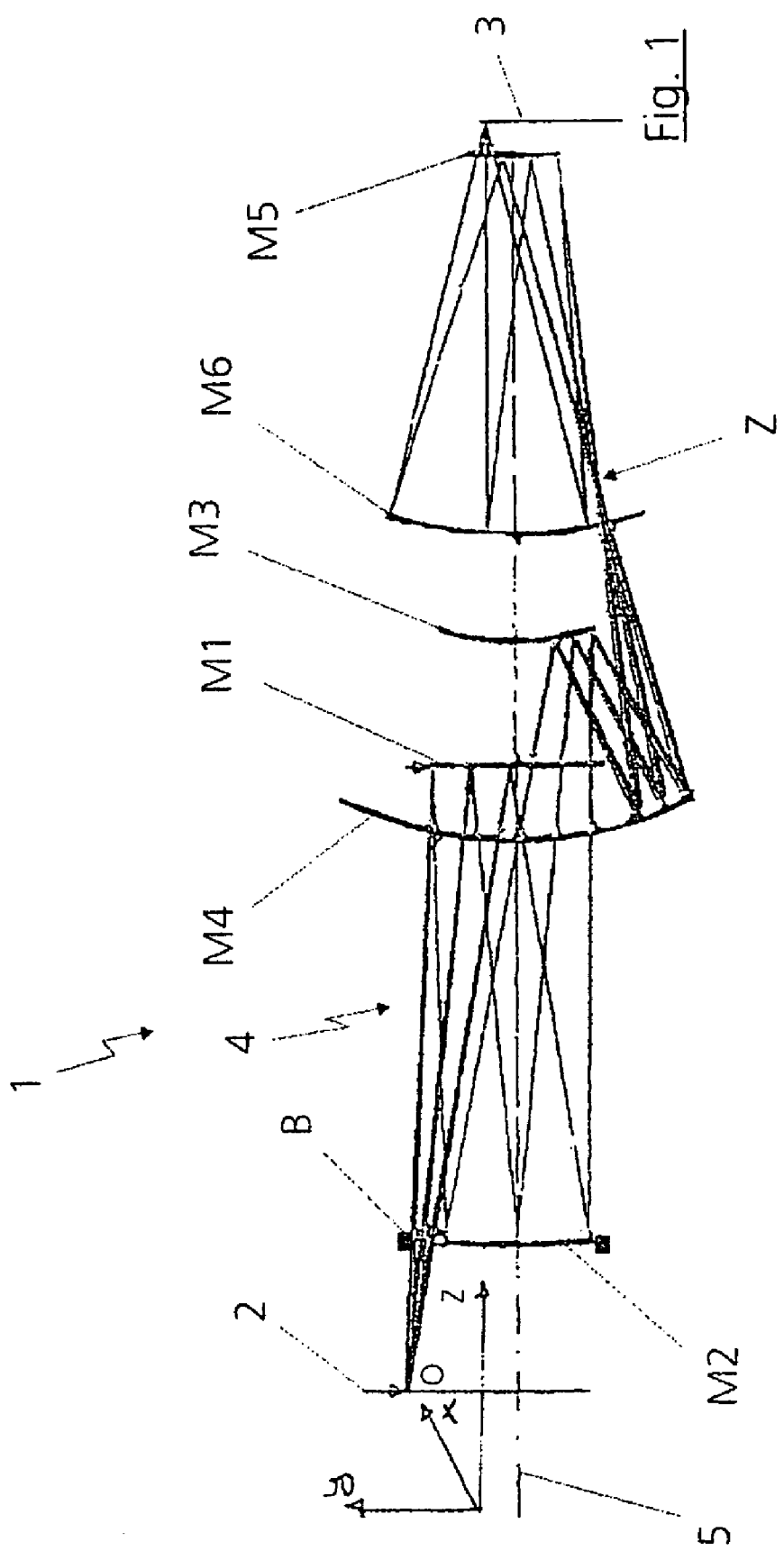
FIG. 1 shows a schematic of a 6-mirror projection objective as is known from DE 100 378 70 A1.

FIG. 1 shows an exemplary 6-mirror projection objective 1, as known from the prior art, for example in accordance with DE 100 37 870 A1, when used in the EUV region with wavelengths $\lambda<157$ nm, in particular $\lambda<20$ nm, an object O being located in an object place 2. Here, the object O to be imaged constitutes a mask or a reticle in lithography. The object O is imaged into an image plane 3 via a first mirror M1, a second mirror M2, a third mirror M3, a fourth mirror M4, a fifth mirror M5 and a sixth mirror M6. In lithography, a wafer is arranged in the image plane 3, for example. The six mirrors M1, M2, M3, M4, M5 and M6 are aspheric mirrors, the first mirror M1 being designed as a convex mirror.

A diagram B restricts the beams 4 traversing the system 1. Here, the diaphragm B is located directly on the second mirror M2 or in the direct vicinity of the mirror M2. The overall system is arranged in a fashion centered relative to an optical axis 5, and has a telecentric beam path in the image plane 3. Furthermore, as is clearly evident in FIG. 1, an intermediate image Z is formed between the fourth mirror M4 and the fifth mirror M5. This intermediate image Z is imaged, in turn, into the image plane 3 via the mirrors M5 and M6.

Figure 2:
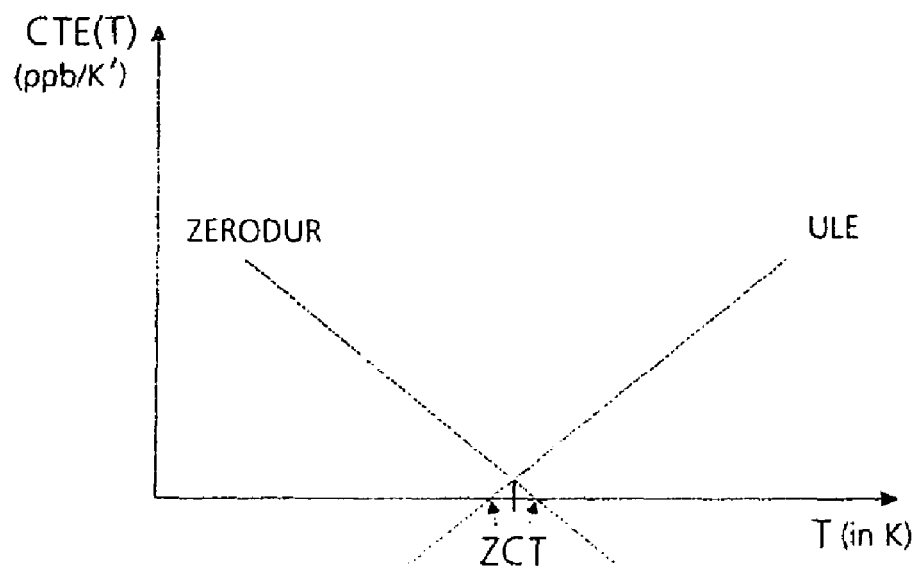
FIG. 2 shows an illustration of the dependence of the CTE (T) on the temperature in the region of the zero crossing temperature (ZCT)

The coefficients of thermal expansion (CTE) of suitable glass ceramic materials such as, for example, ZERODUR® or ClearCeram-Z®, as also of amorphous titanium silicate glasses such as for example, ULE®, can be made to vanish at a specific temperature that can be set in certain ranges, specifically the zero crossing temperature (ZCT), as is shown schematically in FIG. 2. However, the two material classes differ from one another, inter alia, in the dependence of the coefficient of thermal expansion on the temperature in the region of the zero crossing temperature. Likewise, the special functional profile of the coefficient of thermal expansion differs with reference to temperature and the distribution of inhomogeneities. The zero crossing temperature should lie in the range between 0 and 100° C., advantageously between 10 and 50° C. In the case of ZERODUR® the term $$\frac{d}{dT}CTE(T)$$

is negative near the ZCT, while in the case of ULE® the term $$\frac{d}{dT}CTE(T)$$

is positive. A typical target value for the absolute value of this variable is $$\frac{d}{dT}CTE(T) = 1.6 \text{ ppb/K}^2.$$

However, it is possible in this case for the exact values of these terms to deviate from those mentioned here, but attention centers particularly on the different signs of the two CTE increases in the region of the zero crossing temperature (ZCT). Use should advantageously be made of materials that have a rise in coefficient of thermal expansion of below 100 ppb/K$^2$, in particular below 10 ppb/K$^2$ in absolute terms. Particularly preferred, however, are materials that have a rise in the CTE of below 2 ppb/K$^2$ in absolute terms, such as ZERODUR® or ULE®, for example.

These properties of the glass ceramic materials, as also of the amorphous titanium silicate glasses, can now be used for the purpose of compensating global and local temperature increases such that resulting effects and still existent aberrations are minimized. This is performed by suitably allocating to the individual mirrors M1, M2, M3, M4, M5 and M6 the two different mirror materials, which differ from one another in the rise in the coefficient of thermal expansion as a function of temperature, in particular in the sign of the size. To this end, finite element analyses are firstly used to determine the temperature distributions to be expected, and to determine the resulting surface deformations therefrom, in turn. These surface deformations are then superposed on the ideal surfaces in an optical ray tracing program (for example Code V), and the resulting aberrations are determined. By selecting the mirrors from the correct materials, the aberration occurring most clearly, such as distortion (NCE), image field curvature (FPD), astigmatism (AST), coma (Zernike coefficient 7/8), spherical aberration (Zernike coefficient Z9) and the RMS of the wavefront errors can be influenced, and the effects deriving therefrom can be minimized.

By balancing out the temperature-induced aberrations through the use of ZERODUR® and ULE® for the mirrors, the overall projection objective 1 can be operated with relatively strong light sources, and so it is possible to ensure a higher wafer throughput and a higher productivity. It is thereby possible to achieve an assembly of the projection objective 1 from mirrors M1, M2, M3, M4, M5 and M6 that are arranged with regard to their mirror materials in a fashion minimizing thermally induced aberrations.

ULE® is a layered material, as occasioned by the method. At least one curved surfaces, in some circumstances the use of ULE® gives rise owing to the striae occurring thereby to a low-frequency MSFR that, in turn, leads to small angle scattering. Such scattering causes particularly strong interference on mirrors near the pupil, since its effect is a field-dependent nonuniformity in the luminance on the wafer or in the image plane 3. On mirrors near the field, the small angle scattering leads substantially to nonuniformities in the luminance in the pupil, that is to say in the angular distribution of the light beams at a field point. This effect is to be classified as substantially less critical than the nonuniformity of the luminance on the wafer.

The crystallite structure of glass ceramic materials, in particular ZERODUR®, is prepared using specific production methods (see WO 03/16233 A1 or DE 101 27 086 A1 in this regard) and preferably contributes to high-frequency MSFR components and HSFR components, that is to say wide angle scattering is caused. Consequently, it is advantageous when the glass ceramic material or ZERODUR® is preferably used in mirrors where the latter scatter spatial frequencies into angular regions that do not reach the wafer, owing to vignetting or stopping out. Here, the material should preferably be used in mirrors of large beam cross sections, it also being possible to arrange mirrors in the front part, that is to say in the region remote from the wafer, of the objective 1, so that the scattered light is stopped out by the diaphragm B or the other mirrors such that it does not arrive in the wafer plane 3, or does so in a minimized fashion. It is therefore possible to achieve an optimization of the scattered light distribution in the wafer plane by a suitable assemblage of the mirror materials.

Figure 3:
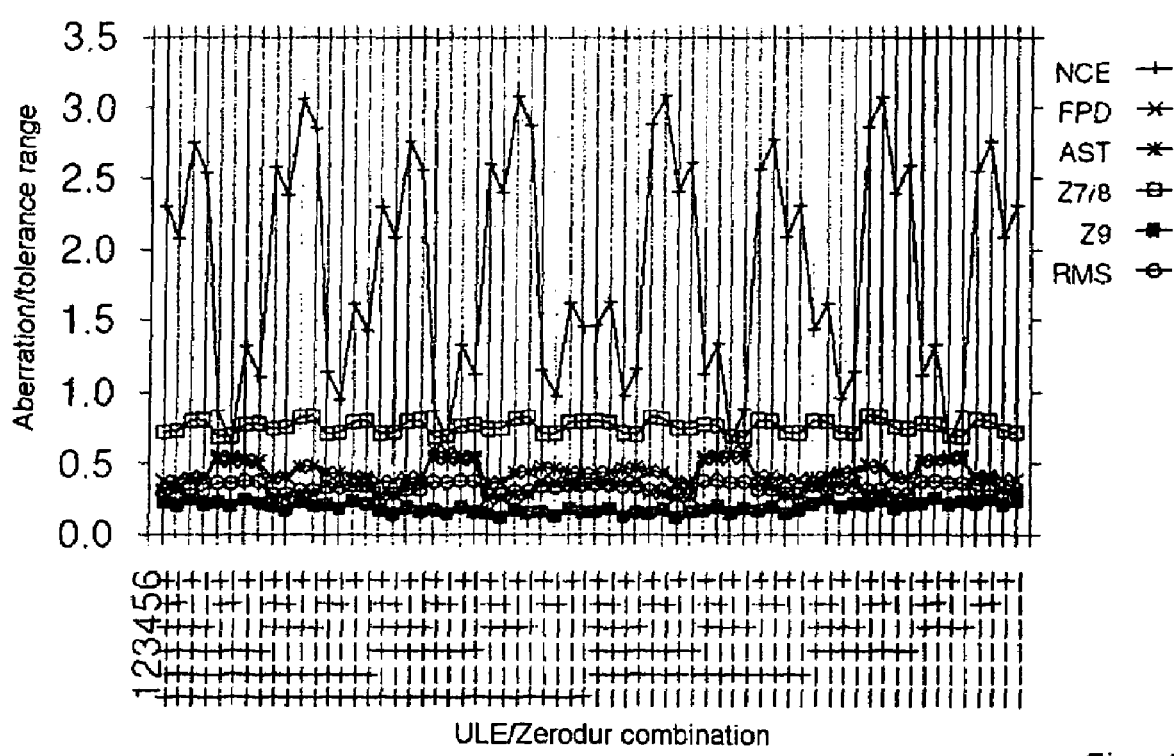
FIG. 3 shows a graph of the sensitivities of the aberrations without manipulator correction.

The sensitivities of the abovenamed aberrations are illustrated in FIG. 3 in conjunction with the allocation of the materials to the individual mirrors M1, M2, M3, M4, M5 and M6 for an exemplary objective relative to a suitably defined tolerance range, the sensitivities of the absolute errors being specified in nm in a fashion ordered by combinations of the materials ZERODUR® and ULE®. The combinations are symmetrical with reference to a common change in sign of the CTE(T) rise on all mirrors M1, M2, M3, M4, M5 and M6. The plus sign stands for the material ULE® and the minus sign for the material ZERODUR® in the respective arranged mirror.

The analyses are carried out with the aid of the following, exemplary, but realistic thermal loads that constitute the absorbed power of the respective mirrors:

|  | Mirror | | | | | |
| --- | --- | --- | --- | --- | --- | --- |
|  | M1 | M2 | M3 | M4 | M5 | M6 |
| Load (mW) | 862 | 540 | 340 | 210 | 130 | 84 |

The CTE inhomogeneities (spatial variation) were not taken into account in these calculations. With reference to FIG. 3, a combination of "+++++−" a $$\frac{d}{dT}CTE(T) = +1.6 \text{ ppb/K}^2$$

on mirrors M1, M2, M3, M4 and M5, and a $$\frac{d}{dT}CTE(T) = -1.6 \text{ ppb/K}^2$$

on the mirror M6. Assuming one and the same material for all the mirrors M1 to M6, from the point of view of the noncorrectible error this then constitutes a poor starting position for correcting this aberration as well as possible. The combinations "++++++" and "−−−−−−" are virtually 2.5 times outside the tolerance range. However, an almost 5 times better system quality can be achieved given a suitable material mix.

A further optimization of the material mix can be undertaken by arranging ULE® mirrors in regions near the field and not in regions near the pupil. In such a 6-mirror projection objective 1, it is preferably possible to use ULE® for the mirrors M1, M3 and M4.

Figure 4:
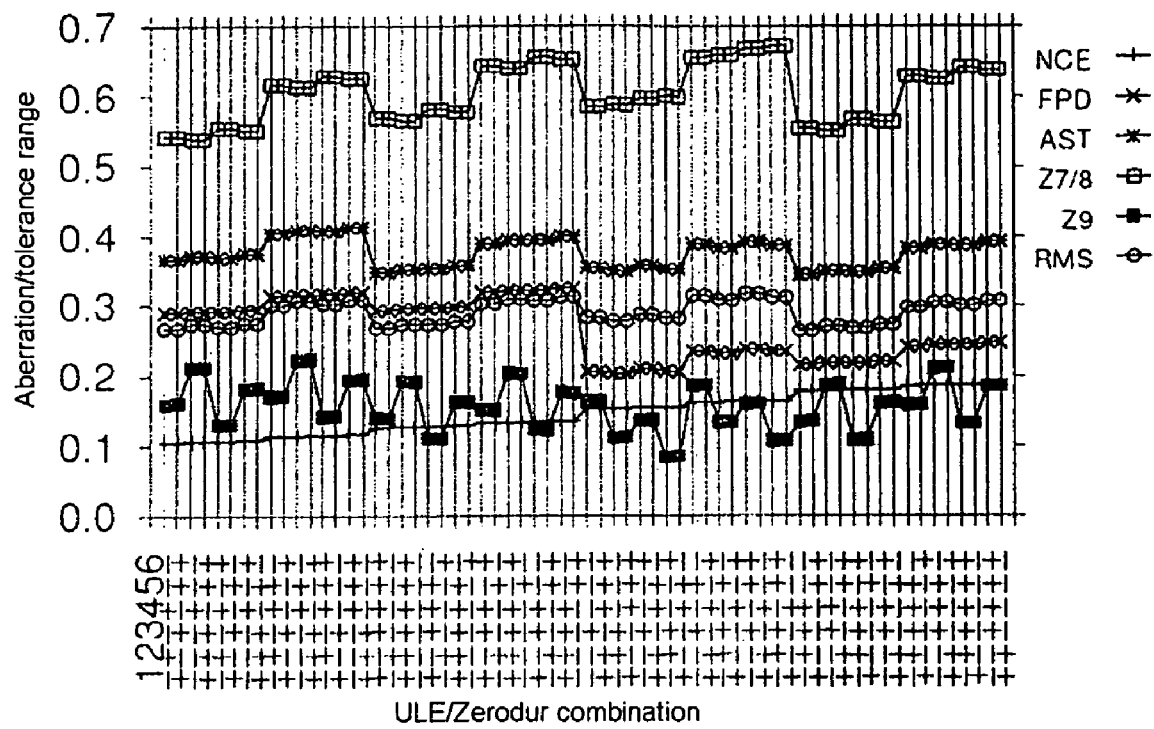
FIG. 4 shows a graph of the compensation of thermally induced aberrations by means of manipulators.

FIG. 4 illustrates the compensation of the thermally induced aberrations by the use of manipulators that permit a total body movement of the individual mirrors M1, M2, M3, M4, M5 and M6 during operation. For arbitrary material combinations, FIG. 4 shows that all the aberrations can be controlled within their specified tolerance ranges by changing the spacings, the decentering and the tilting of the mirrors M1, M2, M3, M4, M5 and M6.

The high price of the manipulators, which generally have to be operated in vacuum by remote control, is one disadvantage of this compensation method, as is also the dead time of the wafer exposure apparatus that is caused during operation by the measurement and compensation of the aberrations. The dead time gives rise to losses in production and thus to substantial economic losses.

Figure 5:
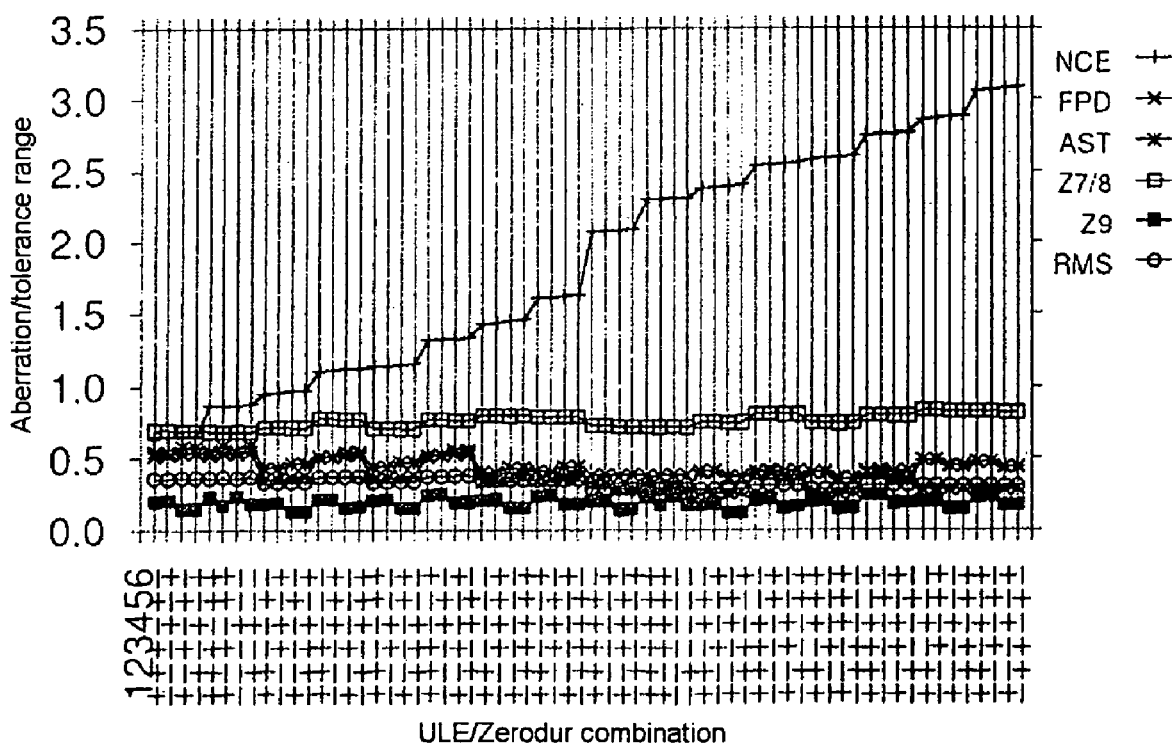
FIG. 5 shows a graph of a material mix optimization for the distortion (NCE).

FIG. 5 is a graph of a material mix optimization for the distortion (NCE). Here, the sensitivities without manipulator correction from FIG. 4 are illustrated arranged according to NCE residual errors. The left-hand side of the graph in FIG. 5 illustrates the material mix that causes the lowest NCE. It may be seen here, for example, that a mix of "+++−+−" or "−−−+−+" supplies the lowest NCE. It is to be seen with particular clarity for such an ULE®-ZERODUR® combination that all the aberrations NCE, FPD, AST, Z7/8, Z9 and RMS are already to be found within the tolerance range without expensive manipulator correction, as is evident from FIG. 5.

It has therefore now been shown clearly that the distortion (NCE), in particular, can be influenced by a material combination with ULE®/ZERODUR®. Likewise, other aberrations can also be influenced and minimized by such a material combination.

The specified material distribution was determined for an exemplary system with an exemplary temperature distribution without being limited thereto. Optimum material combinations differing from one another in the sense of the invention can occur for other optical systems or temperature distributions.

It is to be expected that spatial inhomogeneities of the CTE distribution will lead to surface deformations in the event of temperature changes. These will more or less simulate the frequency response of the CTE variation. However, the conduct of simulations has shown that it is substantially low-frequency and middle-frequency errors that are relevant (>1 mm, MSFR or the form errors). An example of a possible cause of such relevant errors is the thermal deformation, which is proportional to the domain size. On the other hand, the cause can reside in the elastomechanical properties of the solid itself, and this leads to stronger damping at higher spatial frequencies. The frequency distribution of these inhomogeneities is a function of material, and so it is possible to carry out optimization here, as well.

It is to be assumed as a matter of course that other materials will also be conceivable for optimizing such aberrations. Likewise, the invention should not be limited only to EUVL components. Depending on thermal specification and scattered light specification, it can be advantageous to optimize reflective components preferentially from these points of view, for example in a 157 nm lithography system.

We claim:

1. A projection objective for short wavelengths, in particular for wavelengths λ<157 nm, having a number of mirrors that are arranged positioned precisely in relation to an optical axis, and wherein the mirrors have multilayer coatings, characterized in that there are provided for the mirrors at least two different mirror materials that differ in the rise in coefficient of thermal expansion as a function of the temperature in the region of the zero crossing of the coefficients of thermal expansion, in particular in the sign of the rise.

2. The projection objective as claimed in claim 1, wherein a rise in coefficients of thermal expansion of below 100 ppb/$K^2$, in particular below 10 ppb/$K^2$, in absolute terms is provided.

3. The projection objective as claimed in claim 1 or 2, wherein the zero crossing temperature is located in a range between 0 to 100° C., in particular between 10 to 50° C.

4. The projection objective as claimed in claim 1, wherein said wavelengths comprise EUV region wavelengths λ<20 nm.

5. The projection objective as claimed in claim 1, wherein at least one of said mirrors is made from a glass ceramic material, and at least one of said mirrors is made from an amorphous titanium silicate glass.

6. The projection objective as claimed in claim 5, wherein the sign of the rise in the coefficient of thermal expansion of the glass ceramic material is negative in the region of the zero crossing of the coefficient of thermal expansion of the glass ceramic material.

7. The projection objective as claimed in claim 5, wherein the sign of the rise in the coefficient of thermal expansion of the amorphous titanium silicate glass is positive in the region of the zero crossing of the region of the zero crossing of the coefficient of thermal expansion of the amorphous titanium silicate glass.

8. The projection objective as claimed in claim 5, wherein the glass ceramic material is provided for mirrors with large beam cross sections.

9. The projection objective as claimed in claim 5, wherein the glass ceramic material is provided for mirrors in the objective region remote from the wafer.

10. The projection objective as claimed in claim 1, characterized by an assembly of mirrors that are arranged with regard to their mirror materials in a fashion minimizing thermally induced aberrations.

11. The projection objective as claimed in claim 1, characterized by an assembly of mirrors that are arranged with regard to their mirror materials so as to optimize a scattered light distribution in a wafer plane.

12. The projection objective as claimed in claim 1, characterized by an assembly of mirrors that are arranged with regard to their mirror materials in such as a way as to provide a minimization of wavefront errors caused by CTE inhomogeneities.

13. An X-ray optical subsystem for a projection objective in accordance with one of claims 8 to 12.

14. A projection exposure apparatus for EUV lithography comprising optical components, in particular mirrors, reticles or beam splitters, characterized in that provided for the optical components are at least two different substrate materials that differ in the rise of the coefficient of thermal expansion as a function of temperature in the region of zero crossing of the coefficients of thermal expansion, in particular in the sign of the rise.

15. The projection exposure apparatus as claimed in claim 14, wherein a rise in coefficients of thermal expansion of below 100 ppb/$K^2$, in particular below 10 ppb/$K^2$, in absolute terms is provided.

16. The projection exposure apparatus as claimed in claim 14 or 15, wherein the zero crossing temperature has a range of between 0 to 100° C., in particular between 10 to 50° C.

17. The projection exposure apparatus as claimed in claim 14, wherein at least one optical component made from a glass ceramic material is provided, and at least one optical component made from an amorphous titanium silicate glass is provided.

18. The projection exposure apparatus as claimed in claim 14, characterized by an assembly of optical components that are arranged with regard to their substrate materials in a fashion reducing thermally induced aberrations.

19. The projection exposure apparatus as claimed in claim 14, characterized by an assembly of optical components that are arranged with regard to their substrate materials so as to optimize a scattered light distribution in a wafer plane.

20. The projection exposure apparatus as claimed in claim 14, characterized by an assembly of optical components that are arranged with regard to their substrate materials in such as a way as to provide a minimization of wavefront errors caused by CTE inhomogeneities.

21. An X-ray optical subsystem, in particular mirror, reticle or beam splitter, for X-radiation of wavelength $\lambda_R$, characterized by at least two different substrate materials that differ in the rise in coefficient of thermal expansion as a function of temperature in the region of the zero crossing of the coefficients of thermal expansion, in particular in the sign of the rise.

22. The X-ray optical subsystem as claimed in claim 21, wherein the wavelength is $\lambda_R<200$ nm, in particular $\lambda_R<157$ nm.

23. The X-ray optical subsystem as claimed in claim 21, wherein the substrate material is a glass ceramic material.

24. The X-ray optical subsystem as claimed in claim 21, wherein the substrate material is a titanium silicate glass.

25. Use of X-ray optical subsystems as claimed in one of claims 21 to 24 in X-ray microscopy, X-ray astronomy or X-ray spectroscopy.

* * * * *

UNITED STATES PATENT AND TRADEMARK OFFICE
CERTIFICATE OF CORRECTION

PATENT NO. : 7,557,902 B2  
APPLICATION NO. : 10/577163  
DATED : July 7, 2009  
INVENTOR(S) : Udo Dinger et al.

Page 1 of 1

It is certified that error appears in the above-identified patent and that said Letters Patent is hereby corrected as shown below:

Column 4, line 21:
    delete "object place" and replace with --object plane--

Column 4, line 29:
    delete "diagram" and replace with --diaphragm--

Column 5, line 48:
    delete "least one curved" and replace with --least on curved--

Signed and Sealed this

Twenty-second Day of December, 2009

David J. Kappos  
*Director of the United States Patent and Trademark Office*